(12) United States Patent
Manassen et al.

(10) Patent No.: US 11,967,535 B2
(45) Date of Patent: Apr. 23, 2024

(54) ON-PRODUCT OVERLAY TARGETS

(71) Applicant: KLA CORPORATION, Milpitas, CA (US)

(72) Inventors: Amnon Manassen, Haifa (IL); Vladimir Levinski, Migdal Ha'emek (IL); Ido Dolev, Manof (IL); Yoram Uziel, Yodfat (IL)

(73) Assignee: KLA CORPORATION, Milpitas, CA (US)

( * ) Notice: Subject to any disclaimer, the term of this patent is extended or adjusted under 35 U.S.C. 154(b) by 357 days.

(21) Appl. No.: 17/519,512

(22) Filed: Nov. 4, 2021

(65) Prior Publication Data

US 2022/0328365 A1  Oct. 13, 2022

Related U.S. Application Data

(60) Provisional application No. 63/227,295, filed on Jul. 29, 2021, provisional application No. 63/174,045, filed on Apr. 13, 2021.

(51) Int. Cl.
*H01L 21/66* (2006.01)
*G03F 7/00* (2006.01)
*H01L 23/544* (2006.01)

(52) U.S. Cl.
CPC .......... *H01L 22/12* (2013.01); *G03F 7/70633* (2013.01); *G03F 7/70683* (2013.01); *H01L 22/30* (2013.01); *H01L 23/544* (2013.01); *H01L 2223/54426* (2013.01)

(58) Field of Classification Search
CPC ....... H01L 22/12; H01L 22/30; H01L 23/544; H01L 2223/54426; G03F 7/70633; G03F 7/70683
See application file for complete search history.

(56) References Cited

U.S. PATENT DOCUMENTS 7,440,105 B2    10/2008  Adel et al.
9,710,728 B2 *   7/2017  Pandev ............... G03F 7/70633
(Continued)

FOREIGN PATENT DOCUMENTS

EP        2458441 B1 *  1/2022  ............... G03F 1/42

OTHER PUBLICATIONS

WIPO, ISR for International Application No. PCT/US2022/011516, May 2, 2022.

*Primary Examiner* — Bilkis Jahan
*Assistant Examiner* — Victor V Barzykin
(74) *Attorney, Agent, or Firm* — Hodgson Russ LLP (57) ABSTRACT

A product includes a semiconductor substrate, with at least first and second thin-film layers disposed on the substrate and patterned to define a matrix of dies, which are separated by scribe lines and contain active areas circumscribed by the scribe lines. A plurality of overlay targets are formed in the first and second thin-film layers within each of the active areas, each overlay target having dimensions no greater than 10 μm×10 μm in a plane parallel to the substrate. The plurality of overlay targets include a first linear grating formed in the first thin-film layer and having a first grating vector, and a second linear grating formed in the second thin-film layer, in proximity to the first linear grating, and having a second grating vector parallel to the first grating vector.

26 Claims, 7 Drawing Sheets

(56) References Cited

U.S. PATENT DOCUMENTS

| | | | |
|---|---|---|---|
| 2013/0157389 A1* | 6/2013 | Wang | G03F 7/70633 257/E21.53 |
| 2015/0050755 A1* | 2/2015 | Ausschnitt | G03F 7/70633 257/797 |
| 2015/0241790 A1* | 8/2015 | Pierson | G03F 7/70625 702/35 |
| 2015/0323471 A1 | 11/2015 | Sapiens et al. | |
| 2018/0051984 A1 | 2/2018 | Shchegrov et al. | |
| 2018/0130845 A1* | 5/2018 | Ko | H01L 22/30 |
| 2018/0233419 A1* | 8/2018 | Liou | G03F 7/70633 |
| 2019/0252270 A1 | 8/2019 | Hoo et al. | |
| 2019/0285407 A1 | 9/2019 | Chuang et al. | |
| 2020/0116655 A1 | 4/2020 | Hench et al. | |

* cited by examiner

ON-PRODUCT OVERLAY TARGETS

CROSS-REFERENCE TO RELATED APPLICATION

This application claims the benefit of U.S. Provisional Patent Application 63/174,045, filed Apr. 13, 2021, and U.S. Provisional Patent Application 63/227,295, filed Jul. 29, 2021, which are incorporated herein by reference in their entireties.

FIELD OF THE INVENTION

The present invention relates generally to manufacture of semiconductor devices, and particularly to methods and target features for semiconductor circuit metrology.

BACKGROUND

Semiconductor circuits are commonly manufactured using photolithographic methods. In photolithography, a thin layer of a photosensitive polymer (photoresist) is deposited over a semiconductor substrate and patterned using optical or other radiation, leaving parts of the substrate covered by the photoresist. After patterning, the substrate is modified by methods such as etching and ion bombardment to change the material properties or the topography of the substrate, while the parts of the substrate covered by the photoresist are not affected.

Semiconductor circuit metrology is used for measuring properties of the patterned photoresist, such as the topography and location of the patterned features. Accurate location of the patterned features of the photoresist with respect to previous process layers is crucial for assuring a high yield of the photolithographic process. Any error in the registration (misregistration) of the patterned photoresist with respect to an underlying process layer is referred to as "overlay error." As an example, in typical semiconductor circuits with minimum line-widths of 10-14 nm (so-called 10-nm design rule), the maximal permissible overlay error is 2-3 nm. In leading-edge semiconductor circuits, the line-widths are shrinking to 5 nm, with a concomitant reduction in maximal permissible overlay error.

Overlay error is commonly measured using optical overlay metrology tools, as optical radiation in the visible and near-infrared wavelengths is capable of penetrating through the photoresist layer, as well as through dielectric layers under the photoresist. Optical overlay metrology tools, such as the Archer™-series tools by KLA Corporation (Milpitas, CA, USA), image an overlay target (such as AIM™ overlay target by KLA) located in the scribe lines of the semiconductor substrate (the lines separating adjacent dies). An image analysis algorithm is applied to the acquired images in order to locate the center of symmetry (CoS) of the target features in the process layer and the CoS of the target features in the patterned photoresist layer. The overlay error is computed as the distance between the centers of symmetry of the target features of the two layers.

U.S. Pat. No. 7,440,105, whose disclosure is incorporated herein by reference, describes overlay marks and methods for determining overlay error. One aspect of this patent relates to a continuously varying offset mark. The continuously varying offset mark is a single mark that includes overlaid periodic structures, which have offsets that vary as a function of position. By way of example, the periodic structures may correspond to gratings with different values of a grating characteristic such as pitch. Another aspect of the patent relates to methods for determining overlay error from the continuously varying offset mark.

The terms "optical rays," "optical radiation," "light," and "beams of radiation," as used in the present description and in the claims, refer generally to any and all of visible, infrared, and ultraviolet radiation.

SUMMARY

Embodiments of the present invention that are described hereinbelow provide improved target features and methods for semiconductor circuit metrology.

There is therefore provided, in accordance with an embodiment of the invention, a product including a semiconductor substrate and at least first and second thin-film layers disposed on the substrate and patterned to define a matrix of dies, which are separated by scribe lines and contain active areas circumscribed by the scribe lines. A plurality of overlay targets are formed in the first and second thin-film layers within each of the active areas, each overlay target having dimensions no greater than 10 µm×10 µm in a plane parallel to the substrate. The overlay targets include a first linear grating formed in the first thin-film layer and having a first grating vector, and a second linear grating formed in the second thin-film layer, in proximity to the first linear grating, and having a second grating vector parallel to the first grating vector.

In some embodiments, the overlay targets have dimensions no greater than 5 µm×5 µm.

In additional embodiments, the plurality of overlay targets includes a first set of the overlay targets characterized by a first angular disposition of the first and second linear gratings and a second set of the overlay targets characterized by a second angular disposition of the first and second linear gratings that is rotated with respect to the first angular disposition by 180° around an axis perpendicular to the plane parallel to the semiconductor substrate.

Additionally or alternatively, the plurality of overlay targets includes a first set of the overlay targets characterized by a first angular disposition of the first and second linear gratings and a second set of the overlay targets characterized by a second angular disposition of the first and second linear gratings that is rotated with respect to the first angular disposition by 90° around an axis perpendicular to the plane parallel to the semiconductor substrate.

In a disclosed embodiment, each of the overlay targets includes exactly one first linear grating and one second linear grating.

Additionally or alternatively, the second linear grating is adjacent to but non-overlapping with the first linear grating in the plane parallel to the semiconductor substrate.

In one embodiment, the first linear grating includes a first sub-grating having a first pitch and a second sub-grating adjacent to but non-overlapping with the first sub-grating, having a second pitch not equal to the first pitch, and the second linear grating includes a third sub-grating, which has a third pitch equal to the second pitch and is overlaid on the first sub-grating, and a fourth sub-grating, which is adjacent to but non-overlapping with the third sub-grating and has a fourth pitch equal to the first pitch, and is overlaid on the second sub-grating.

In some embodiments, the product includes further overlay targets formed within the scribe lines and having dimensions greater than 5 µm×5 µm in the plane parallel to the substrate.

There is also provided, in accordance with an embodiment of the invention, a method for measuring an overlay error. The method includes depositing and patterning at least first and second thin-film layers on a semiconductor substrate to define a matrix of dies, which are separated by scribe lines and contain active areas circumscribed by the scribe lines. A plurality of overlay targets are formed in the first and second thin-film layers within each of the active areas, each overlay target having dimensions no greater than 10 µm×10 µm in a plane parallel to the substrate and including a first linear grating formed in the first thin-film layer and having a first grating vector and a second linear grating formed in the second thin-film layer, in proximity to the first linear grating, and having a second grating vector parallel to the first grating vector. The method further includes capturing images of the plurality of overlay targets, processing the image to find a displacement between the first and second linear gratings, and measuring an overlay error between the first and second thin-film layers responsively to the displacement.

There is additionally provided, in accordance with another embodiment of the invention, a method for measuring an overlay error. The method includes depositing and patterning at least first and second thin-film layers on a semiconductor substrate to define a matrix of dies, which are separated by scribe lines and contain active areas circumscribed by the scribe lines. A plurality of overlay targets are formed in the first and second thin-film layers, each overlay target including respective first target features in the first thin-film layer and respective second target features in the second thin-film layer. First images of the plurality of overlay targets are captured in a first angular orientation of the semiconductor substrate with respect to a normal to the semiconductor substrate and are processed to find respective first displacements between the first and second target features. Second images of the plurality of overlay targets are captured in a second angular orientation of the semiconductor substrate that is rotated relative the first angular orientation with respect to the normal to the semiconductor substrate and are processed to find respective second displacements between the first and second target features. A model of overlay error between the first and second thin-film layers is computed based on the first and second displacements, and the overlay error at a given location on the semiconductor substrate is computed using the model.

In some embodiments, computing the model includes applying a scanner model, which takes into account both misplacement of the semiconductor substrate between subsequent patterning stages in photolithographic patterning the first and second thin-film layers and optical distortions in the photolithographic patterning.

In a disclosed embodiment, the second angular orientation is rotated by 180° with respect to the normal relative to the first angular orientation. Additionally or alternatively, computing the model includes creating first and second overlay models based respectively on the first and second displacements, and computing the overlay error includes calculating a difference between first and second overlay errors provided respectively by the first and second overlay models at the given location on the semiconductor substrate. Further additionally or alternatively, computing the overlay error includes computing a tool-induced shift at the given location on the semiconductor substrate by computing an average of respective values of the first and second overlay errors at the given location.

In some embodiments, forming the plurality of overlay targets includes forming at least some of the overlay targets within the active areas of the dies. Additionally or alternatively, each of the overlay targets within the active areas has dimensions no greater than 10 µm×10 µm.

In further embodiments, forming the plurality of overlay targets includes forming in each of the overlay targets a first linear grating in the first thin-film layer and a second linear grating in the second thin-film layer, in proximity to the first linear grating, such that a first set of the overlay targets is characterized by a first angular disposition of the first and second linear gratings and a second set of the overlay targets is characterized by a second angular disposition of the first and second linear gratings that is rotated with respect to the first angular disposition by 180° around the normal to the semiconductor substrate.

In additional embodiments, forming the plurality of the overlay targets includes forming in each of the overlay targets a first linear grating in the first thin-film layer and a second linear grating in the second thin-film layer, in proximity to the first linear grating, such that a first set of the overlay targets is characterized by a first angular disposition of the first and second linear gratings and a second set of the overlay targets is characterized by a second angular disposition of the first and second linear gratings that is rotated with respect to the first angular disposition by 90° around the normal to the semiconductor substrate.

In an alternative embodiment, computing the model includes creating an overlay model based on the first displacements, and computing the overlay error includes calculating a difference between a first overlay error provided by the overlay model and a second overlay error measured based on the second displacements at the given location on the semiconductor substrate.

The present invention will be more fully understood from the following detailed description of the embodiments thereof, taken together with the drawings in which:

DETAILED DESCRIPTION OF EMBODIMENTS

Overview

Overlay targets for overlay metrology are commonly used for precise and accurate measurements of the overlay error between successive patterned layers on a semiconductor substrate. These layers may comprise, for example, a process layer and a resist layer (photoresist), or, in after-etch applications, two process layers. Thus, although some example embodiments are described below with reference to a process layer and a resist layer, the principles of these embodiments may be applied, mutatis mutandis, to a first process layer and a second process layer.

Some overlay targets, such as the AIM™-target, comprise gratings oriented in two orthogonal directions (x- and y-directions), designed to satisfy the following requirements:
- 180° rotational symmetry for enabling the measurement of tool-induced shift (TIS), requiring two quadrants with gratings in the x-direction and two quadrants in the y-direction;
- pitch exceeding 1600 nm for enabling sufficient contrast of the gratings;
- at least three lines per grating for enabling the determination of the spatial phase of the grating; and
- two gratings per quadrant (one grating for process layer and one grating for resist layer, or one grating for each of two consecutive process layers).

For each layer, the center of symmetry of the AIM™-target for that layer is determined through correlation between the two gratings in the x-direction (for x-overlay error) and the two gratings in the y-direction (for y-overlay error). The overlay error between the two layers can then be estimated accurately based on the distance between the respective two centers of symmetry in the x- and y-directions. To meet the requirements listed above, however, the size of the overlay target is typically at least 20 µm×20 µm. An overlay target of this size can fit in the scribe lines of the semiconductor substrate, but not in the active areas of the dies (also referred to as the device areas) between the scribe lines. It would be desirable to reduce the dimensions of the overlay targets to a size that can practically fit within the active area, to enable accurate measurement of the overlay errors within the active area.

The embodiments of the present invention that are described herein address the problem of fitting overlay targets within the active area by providing targets of reduced size. Each overlay target comprises a pair of adjacent linear gratings with parallel grating vectors, wherein one grating is formed in the process layer and one in the resist layer. (The term "grating vector" refers to a vector in the plane of the grating with a direction perpendicular to the lines of the grating.) For a grating pitch of 1600 nm, the overall size of such an overlay target may be 5 µm×5 µm or even smaller, thus enabling fitting overlay targets of this kind within the active area.

The overlay error between the two layers is measured based on the shift between the two gratings of the overlay target in the direction of the grating vectors. For measuring the overlay error in two orthogonal directions, such as x- and y-directions, separate x- and y-overlay targets are provided with their grating vectors in x- and y-directions, respectively.

In order to satisfy the requirement of 180° symmetry for TIS-measurement, a first group of the x-overlay targets can be printed at 180° rotation with respect to a second group. Similarly, two groups of y-overlay targets can be printed at 180° rotation with respect to one another. By measuring the groups of the overlay targets with the semiconductor substrate oriented at 0° and at 180° and comparing the measurement results, a TIS-correction can be computed for the measured overlay errors. Discrepancies in the TIS computation can be mitigated by printing pairs of targets of opposite rotations close together (to the extent permitted by the device structures) and/or by using overlay error models computed either from larger overlay targets, for example in the scribe lines, or separately (as will be detailed hereinbelow) from each of the two groups of x- and y-overlay targets.

In the disclosed embodiments, at least first and second thin-film layers are disposed on a semiconductor substrate and patterned to define a matrix of dies, which are separated by scribe lines and contain active areas circumscribed by the scribe lines. Multiple overlay targets are formed in the first and second thin-film layers within each of the active areas. Each overlay target has dimensions no greater than 10 µm×10 µm in a plane parallel to the substrate, and includes a first linear grating formed in the first thin-film layer and a second linear grating formed in the second thin-film layer, in proximity to one another and having parallel grating vectors. In additional embodiments, the overlay targets may have dimensions no greater than 5 µm×5 µm.

System Description

Figure 1:
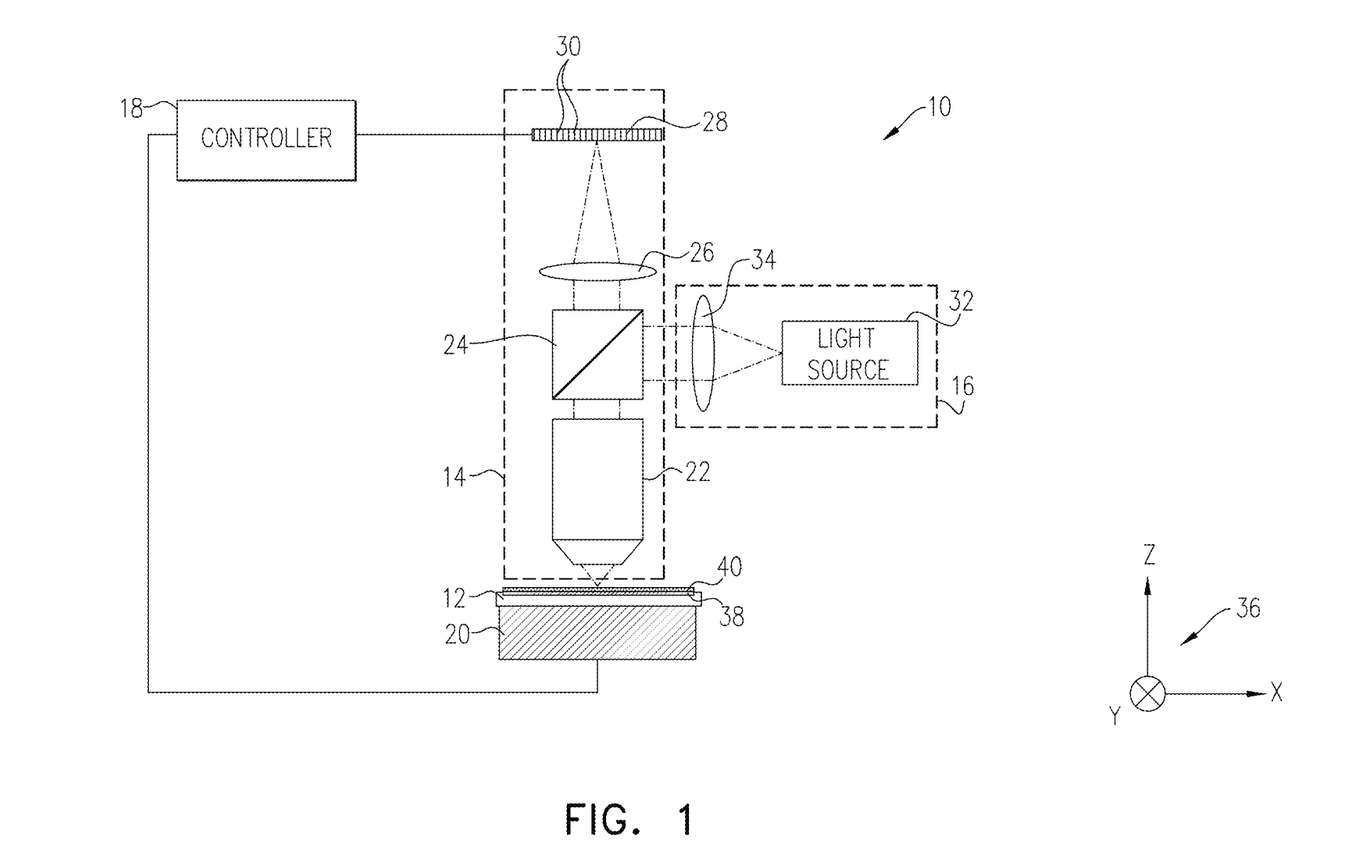
FIG. 1 is a schematic side view of an optical inspection apparatus for measuring overlay error on a semiconductor substrate, in accordance with an embodiment of the invention.

FIG. 1 is a schematic side view of an optical inspection apparatus 10 for measuring overlay error on a semiconductor substrate 12, in accordance with an embodiment of the invention.

Optical inspection apparatus 10 comprises an imaging assembly 14, an illumination assembly 16, a controller 18, and a table 20 on which substrate 12 is mounted. Imaging assembly 14 comprises an objective lens 22, a cube beamsplitter 24, and an imaging lens 26. Imaging assembly 14 further comprises a sensor 28, comprising for example, a complementary metal-oxide-semiconductor (CMOS) detector with a two-dimensional array of pixels 30.

Illumination assembly 16 comprises a light source 32, emitting optical radiation, and a lens 34. Table 20 is located in proximity to objective lens 22, and comprises actuators, controlled by controller 18, which can move the table linearly in x-, y-, and z-directions (with reference to Cartesian coordinates 36), as well as rotate the table around the z-axis. Cartesian coordinates 36 are shown in this and subsequent figures in order to clarify the orientation of these figures with respect to apparatus 10.

In the pictured embodiment, first and second thin-film layers 38 and 40 have been deposited on semiconductor substrate 12 and patterned in a lithographic process, as shown in the figures that follow. In the present example, first layer 38 is a process layer, and second layer 40 is a resist layer, which is deposited over the process layer. Alternatively both of layers 38 and 40 may be process layers.

To measure the overlay error between the pattern in layer 40 and the pattern in underlying layer 38 on substrate 12, target features, as shown in the figures that follow, have been formed by processes of photolithography in layers 38 and 40. Substrate 12 is positioned on table 20 so that the combined optics of lens 22 and lens 26 image the substrate onto sensor 28, i.e., the substrate and the sensor are located at optical conjugate planes.

Controller 18 is coupled to receive images from sensor 28 and to adjust the location and orientation of table 20. Controller 18 typically comprises a programmable processor, which is programmed in software and/or firmware to carry out the functions that are described herein, along with suitable digital and/or analog interfaces for connection to the other elements of apparatus 10. Alternatively or additionally, controller 18 comprises hard-wired and/or programmable hardware logic circuits, which carry out at least some of the functions of the controller. Although controller 18 is shown in FIG. 1, for the sake of simplicity, as a single, monolithic functional block, in practice the controller may comprise multiple, interconnected control units, with suitable interfaces for receiving and outputting the signals that are illustrated in the figures and are described in the text. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like.

To capture an image of overlay targets on semiconductor substrate 12, light source 32 projects a beam of optical radiation to lens 34, which further projects the beam to cube beamsplitter 24. Beamsplitter 24 reflects the beam into objective lens 22, which projects the beam onto substrate 12. The radiation impinging on substrate 12 is scattered back to objective lens 22 and passed on to beamsplitter 24, transmitted to lens 26, and focused onto sensor 28. Controller 18 reads out the images captured by sensor 28 and processes the images in order to identify respective locations of the features of overlay targets in layer 40 and in underlying layer 38 on substrate 12. Controller 18 measures the overlay error between these two patterned layers based on the displacement between the respective locations of the target features.

Figure 2:
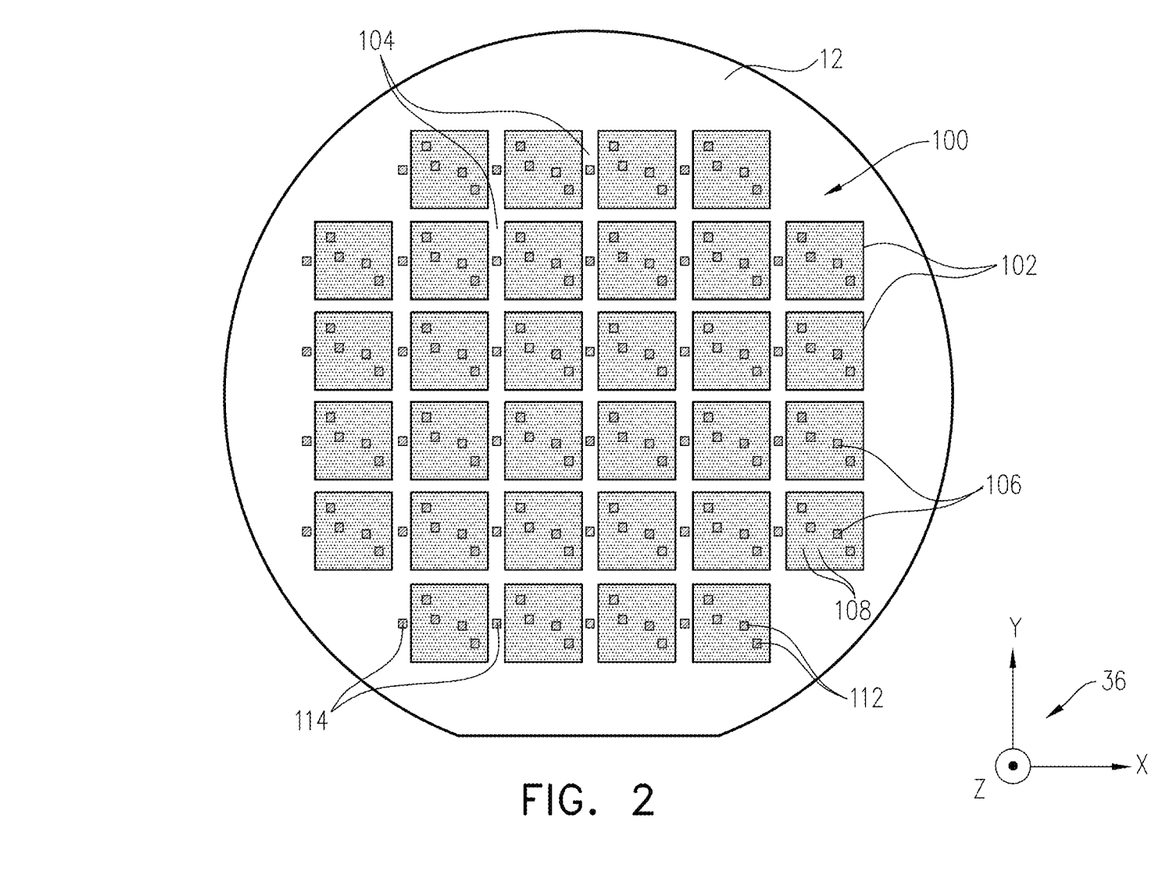
FIG. 2 is a schematic top view of a semiconductor substrate, in accordance with an embodiment of the invention.

FIG. 2 is a schematic top view (from the z-direction) of semiconductor substrate 12, in accordance with an embodiment of the invention. A matrix 100 of dies 102 has been formed on substrate 12 in a photolithographic process. Dies 102 are separated by scribe lines 104 and contain active areas 106 circumscribed by the scribe lines. Semiconductor substrate 12 typically has a diameter of 300 mm. Each die 102 is typically a square with dimensions 20 mm×20 mm, for example, although other sizes and shapes are alternatively used. Scribe lines 104 typically have widths of about 100 μm. Active areas 106 comprise dense electrical circuit components 108 with feature sizes down to a few nanometers.

The thin-film layers on semiconductor substrate 12 (such as layers 38 and 40, shown in FIG. 1) are patterned to define overlay targets 112 within each of active areas 106, interspersed among circuit components 108. To avoid taking up valuable circuit "real estate," each overlay target 112 has dimensions no greater than 10 μm×10 μm in the xy-plane, and possibly even no greater than 5 μm×5 μm. In the pictured embodiment, the thin-film layers are also patterned to define further overlay targets 114 within scribe lines 104, with dimensions greater than 5 μm×5 μm in the xy-plane. The designs of overlay targets 112 and 114 and methods for measuring overlay error using these overlay targets are described further hereinbelow.

Overlay Targets

Figure 3:
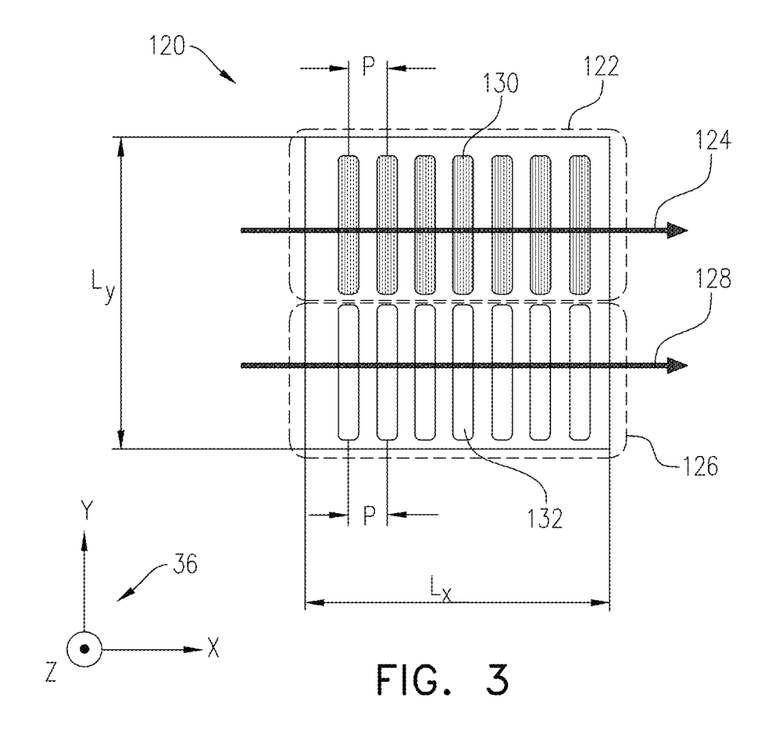
FIG. 3 is a schematic frontal view of an overlay target, in accordance with an embodiment of the invention.

FIG. 3 is a schematic frontal view of an overlay target 120, in accordance with an embodiment of the invention. Target 120 comprises a first linear grating 122, comprising parallel equispaced grating lines 130, formed in layer 38 and having a first grating vector 124, and a second linear grating 126, comprising parallel equispaced grating lines 132, formed in layer 40 and having a second grating vector 128. Gratings 122 and 126 are adjacent to each other but do not overlap. The two gratings have the same grating pitch P. With the target designs described in the current embodiments, the grating pitch P may exceed 1600 nm in order to provide sufficient contrast in the grating images captured by commonly used overlay metrology apparatuses. However, smaller pitches than 1600 nm may also be printed, provided that a sufficient contrast is achieved by the metrology apparatus used for capturing the grating images. Grating vectors 124 and 128 are vectors perpendicular to respective grating lines 130 and 132, and each vector has a length inversely proportional to the grating pitch P.

Gratings 122 and 126 are designed and printed on substrate 12 in the photolithographic process that is used to produce the structures in active areas 106 so that for a zero overlay error in the x-direction between layer 38 and layer 40, the individual lines 130 and 132, respectively, of the two gratings will be aligned with respect to each other in the x-direction. Any overlay error in the x-direction manifests itself in a relative shift of Ax between the two gratings.

This shift is measured by controller 18 (FIG. 1) by capturing images of gratings 122 and 126 and comparing the phases of the two gratings by, for example, computing a correlation between the captured images as a function of a relative shift of the two images. An accurate computation of the relative phase may be made for gratings 122 and 126 having as few as three respective lines 130 and 132. Thus, for example using lines with widths of 1600 nm, the width $L_x$ of overlay target 120 in the x-direction may be less than 5 μm. By using lines 130 and 132 that are short in the y-direction, for example 2 μm, the width $L_y$ of target 120 will also be less than 5 μm, so that the dimensions of the target are less than 5 μm×5 μm in the xy-plane, i.e., a plane parallel to substrate 12. This small size enables targets 120 to be interspersed among circuit components 108 (FIG. 2), with the advantage of measuring the overlay error within the circuits. Furthermore, disposing multiple targets 120 within each active area 106 enables an accurate modeling of the overlay error that may arise due to optical distortions in the photolithographic process within the active area.

Figure 4:
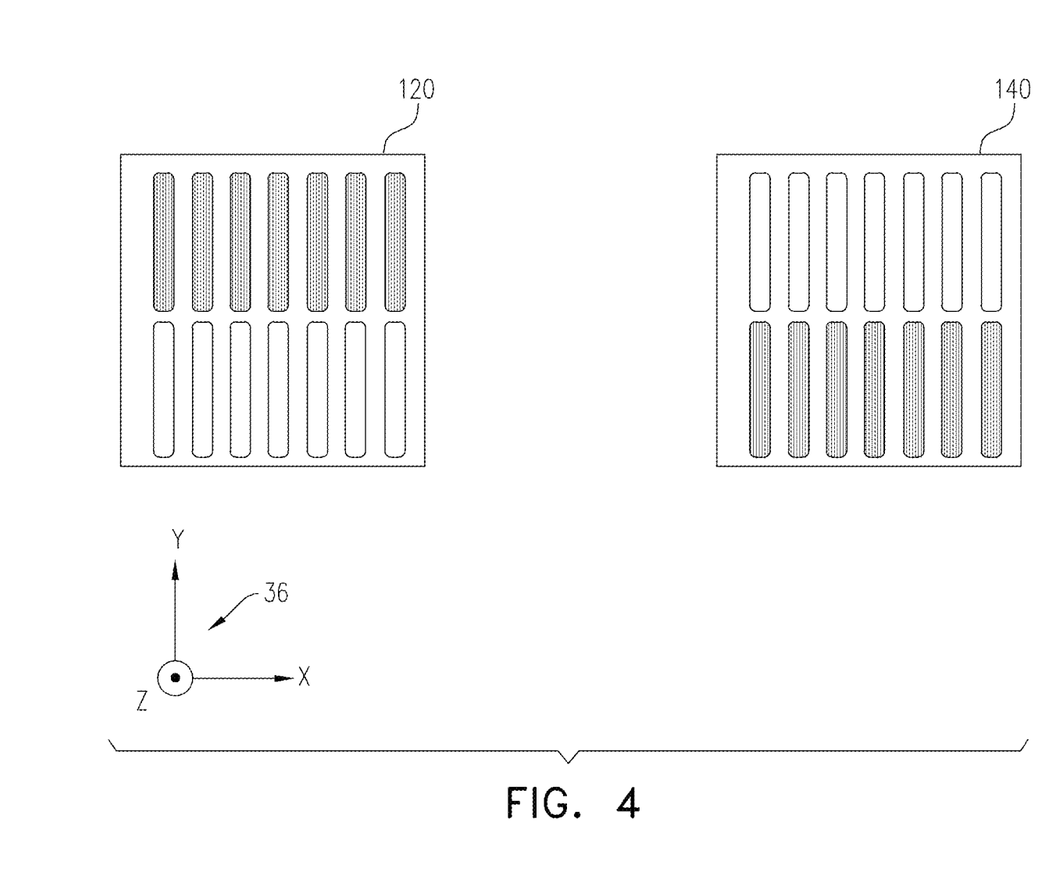
FIG. 4 is a schematic frontal view of a pair of overlay targets, in accordance with an embodiment of the invention.

FIG. 4 is a schematic frontal view of a pair of overlay targets 120 and 140 printed on substrate 12, with one target rotated by 180° with respect to the other, in accordance with an embodiment of the invention. Overlay target 140 is similar to target 120 (FIG. 3), but in an angular disposition that is rotated by 180° around the z-axis with respect to the angular disposition of target 120, i.e., rotated around an axis perpendicular to the plane of substrate 12.

By rotating substrate 12 by 180° around the z-axis (for example in table 20, as shown in FIG. 1), target 140 is brought into an orientation that is nominally identical to target 120 at 0° orientation, and a tool-induced-shift (TIS) in the x-direction may thus be computed by controller 18. For this purpose, controller 18 measures an overlay error $OVL_{x,0}°$ of target 120 before the rotation of substrate 12, and an overlay error $OVL_{x,180}°$ of target 140 after 180°-rotation of the substrate. Controller 18 then computes the TIS in the x-direction, $TIS_x$, as $TIS_x = (OVL_{x,0}° + OVL_{x,180}°)/2$, as well as a TIS-corrected overlay error $OVL_{x,corr}$ as $OVL_{x,corr} = (OVL_{x,0}° - OVL_{x,180}°)/2$. Additionally or alternatively, $OVL_{x,0}°$ may be measured from target 140 before rotating substrate 12, and $OVL_{x,180}°$ from target 120 after the rotation, followed by a $TIS_x$-computation and $OVL_{x,corr}$-computation as described hereinabove.

By having target 120 and target 140 in close proximity to each other, their respective overlay errors and TIS-values are close each other, thus reducing the amount of data to be sampled to measuring only, for example, $OVL_{x,0}°$ from targets 120 and $OVL_{x,180}°$ from targets 140.

Figure 5:
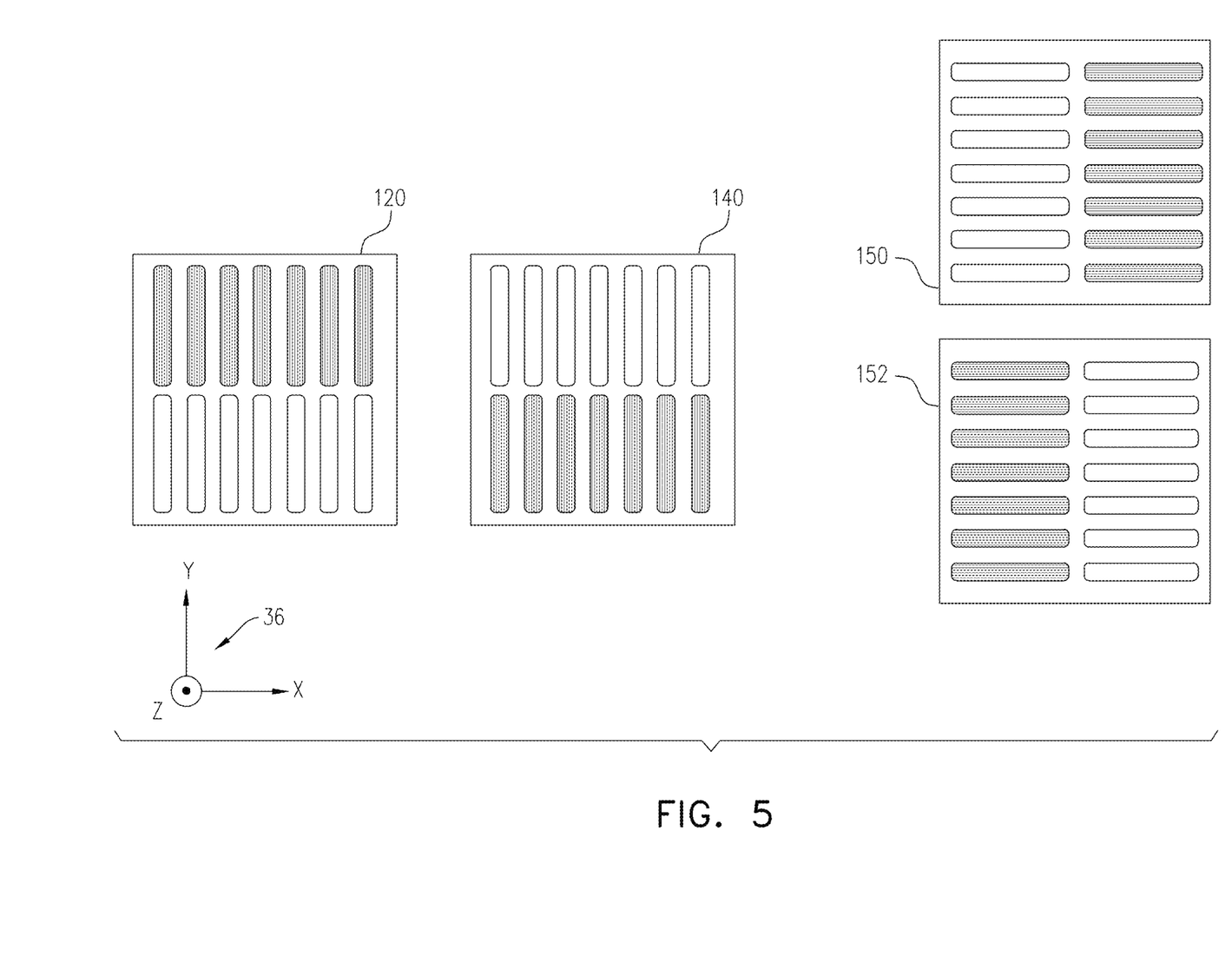
FIG. 5 is a schematic frontal view of two pairs of overlay targets, in accordance with an embodiment of the invention.

FIG. 5 is a schematic frontal view of a pair of overlay targets 120 and 140 for measuring overlay error in the x-direction, and a pair of overlay targets 150 and 152 for measuring overlay error in the y-direction, which are printed on substrate 12 in accordance with an embodiment of the invention. Targets 150 and 152 are similar to targets 120 and 140, respectively, but are rotated by 90°, with target 152 being nominally identical to target 150 after a rotation of substrate 12 by 180°. Similarly to targets 120 and 140 being sensitive to overlay errors in the x-direction, targets 150 and 152 are sensitive to overlay errors in the y-direction. Thus, controller 18 computes TIS in y-direction, $TIS_y$, from the overlay error $OVL_{y,0}°$ measured from target 150 before rotating substrate 12 and overlay error $OVL_{y,180}°$ measured from target 152 after rotating the substrate by 180° as $TIS_y=(OVL_{y,0}°-OVL_{y,180}°)/2$. Controller 18 further computes a TIS-corrected overlay error in the y-direction, $OVL_{y,corr}$, as $OVL_{y,corr}=(OVL_{y,0}°-OVL_{y,180}°)/2$. Similarly to the measurements in x-direction with targets 120 and 140, the measurements in y-direction may be done by switching the roles of targets 150 and 152.

By having targets 120, 140, 150, and 152 suitably disposed among circuit components 108 in active area 106, both TIS and TIS-corrected overlay error may be measured in both x- and y-directions.

Overlay Models and Calibration

In some embodiments of the invention, a scanner model is applied to the measured values of overlay errors across dies 102 and substrate 12 in order to compute an overlay model. The scanner model takes into account both substrate-induced overlay errors, due to linear and rotational misplacement of substrate 12 between subsequent patterning stages in the photolithographic process, and overlay errors within each die 102 due to optical distortions of the optical system (scanner) responsible for the photolithographic patterning. The computed overlay model, in turn, predicts the actual overlay errors at each point in each die 102 on substrate 12, as will be further explained hereinbelow. Although this technique is described here, for the sake of concreteness and clarity, with reference to certain specific sorts of overlay targets that are shown in the figures, the principles of this embodiment may similarly be applied using other suitable types of targets, both within the active areas of dies 102 and in scribe lines 104.

Controller 18 applies the scanner model to compute a two-component 0°-overlay model $M_0°=[M_{x,0}°(x,y), M_{y,0}°(x,y)]$ based on the measurements of x-overlay error $OVL_{x,0}°$ and y-overlay $OVL_{y,0}°$ using targets 120 and 150, respectively, at a 0°-orientation of substrate 12. Commonly the x- and y-overlay errors are measured over multiple dies 102 in order to find both substrate-induced and scanner-induced overlay errors. The 0°-overlay model $M_0°$ gives the x- and y-overlay errors $M_{x,0}°(x,y)$ and $M_{y,0}°(x,y)$, respectively, at each point (x,y) within each die 102. Controller 18 similarly computes a 180°-overlay model $M_{180}°=[M_{x,180}°(x,y), M_{y,180}°(x,y)]$ based on the measurements of x-overlay error $OVL_{x,180}°$ and y-overlay $OVL_{y,180}°$ in multiple dies 102 using targets 140 and 152, respectively, at the 180°-orientation of substrate 12. The 180°-overlay model $M_{180}°$ gives the x- and y-overlay errors $M_{x,180}°(x,y)$ and $M_{y,180}°(x,y)$, respectively, at each point (x,y) within each die 102 modeled from overlay error measurements at 180°.

Alternatively, a corrected overlay error at a point $(x_{180}, y_{180})$, wherein x-overlay error $OVL_{x,180}°$ and y-overlay $OVL_{y,180}°$ have been measured, may be computed by utilizing the 0°-overlay model at this point, $M_0°=[M_{x,0}°(x_{180}, y_{180}), M_{y,0}°(x_{180}, y_{180})]$, together with the measured overlay error. Thus the corrected overlay error may be computed as $[OVL^{corr}_{x,180}°, OVL^{corr}_{y,180}°]=\frac{1}{2}[M_{x,0}°(x_{180}, y_{180})-OVL_{x,180}°, M_{y,0}°(x_{180}, y_{180})-OVL_{y,180}°]$.

At each given point (x,y), controller 18 computes a modeled TIS, $TIS_{mod}=[TIS_{x,mod}, TIS_{y,mod}]$ as $TIS_{mod}=(M_0°+M_{180}°)/2$, and a TIS-corrected modeled overlay error $OVL_{mod}=[OVL_{x,mod}, OVL_{y,mod}]$ as $OVL_{mod}=(M_0°-M_{180}°)/2$. The computations of $TIS_{mod}$ and $OVL_{mod}$ are performed in both x- and y-directions using the respective components of the overlay models $M_0°$ and $M_{180}°$.

Computing the values of tool-induced shift and overlay error from modeled values yields these values at any location over the modeled area on substrate 12. Furthermore, a potential error in the values of TIS and overlay error due to spatial offsets between overlay targets, such as the offset between targets 120 and 140 (FIG. 4), may be eliminated.

Figure 6:
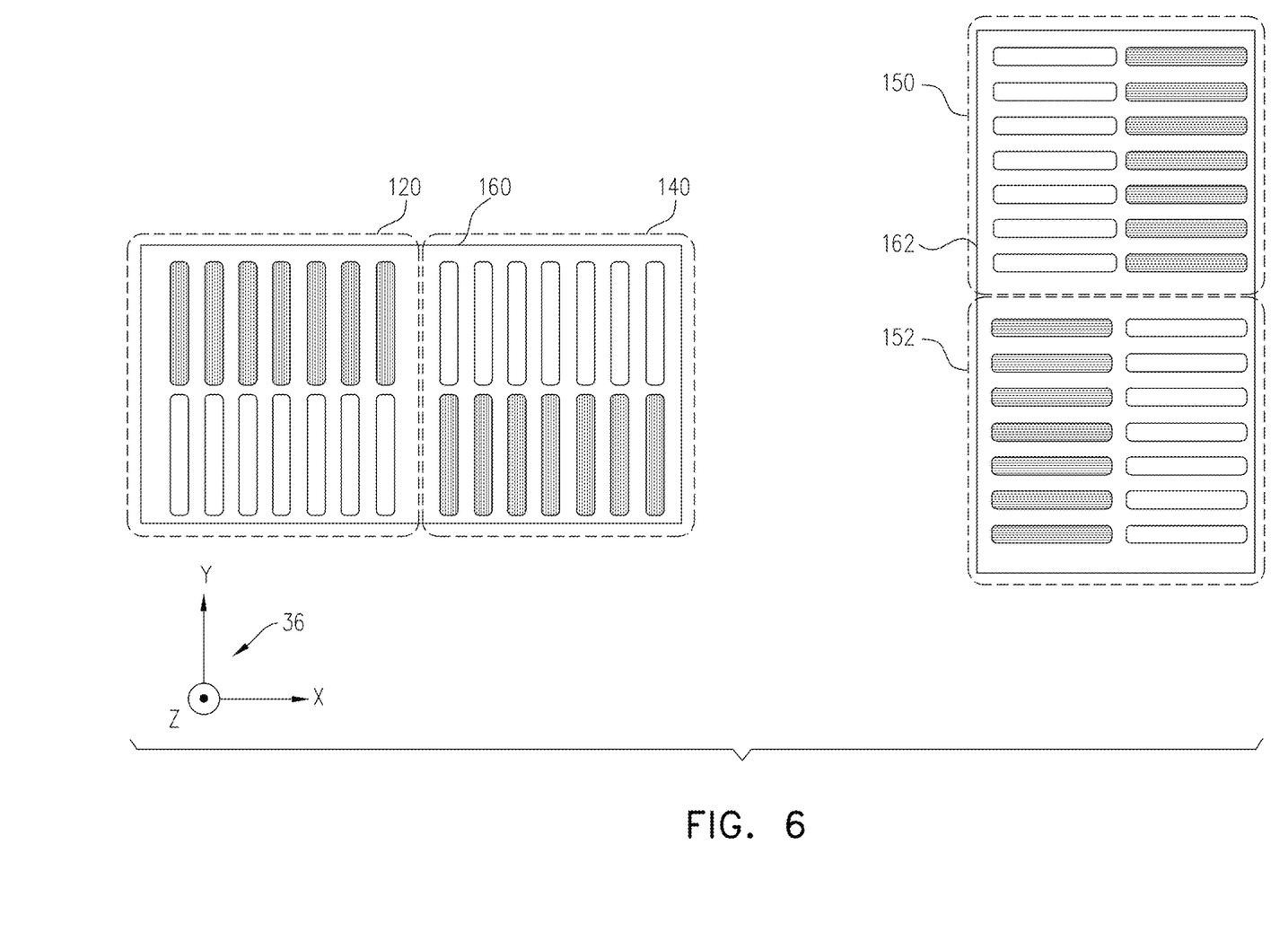
FIG. 6 is a schematic frontal view of a pair of overlay calibration targets, in accordance with an embodiment of the invention.

FIG. 6 is a schematic frontal view of a pair of overlay calibration targets 160 and 162, in accordance with an embodiment of the invention. Calibration targets 160 and 162 are larger than the overlay targets shown in the preceding figures and are therefore placed in scribe lines 104, rather than in active areas 106 (FIG. 2). Targets 160 and 162 can be used in measuring $TIS_{x,scribe}$ and corrected overlay $OVL_{x,scribe,corr}$ across substrate 12. Similarly, multiple targets 162 in scribe lines 104 may be utilized for measuring $TIS_{y,scribe}$ and corrected overlay $OVL_{y,scribe,corr}$ across substrate 12. These values of $TIS_{x,scribe}$, $OVL_{x,scribe,corr}$, $TIS_{y,scribe}$, and $OVL_{y,scribe,corr}$ may be used in conjunction with the overlay targets in active areas 106 for a further calibration of modeled values $TIS_{mod}$ and $OVL_{mod}$.

Calibration target 160 is formed from targets 120 and 140 (FIG. 5) joined together, and calibration target 162 is formed from targets 150 and 152, similarly joined together. Due to the rotational symmetry between targets 120 and 140, calibration target 160 is symmetrical over a 180° rotation. Similarly calibration target 162 is symmetrical over a 180° rotation. As calibration target 160 is formed from overlay targets 120 and 140, the TIS in the x-direction measured from the calibration target faithfully reproduces the TIS measured from overlay targets within die 102, with the exception of possible contributions to TIS due to the location of the calibration target in scribe line 104. Similarly, the TIS measured in the y-direction from calibration target 162 faithfully reproduces the TIS measured from overlay targets 150 and 152 within die 102.

Alternatively or additionally, standard overlay targets, such as AIM™-targets in scribe lines 104 may be used for calibration.

On-Product Overlay Targets with Overlaid Gratings

Figure 7A:
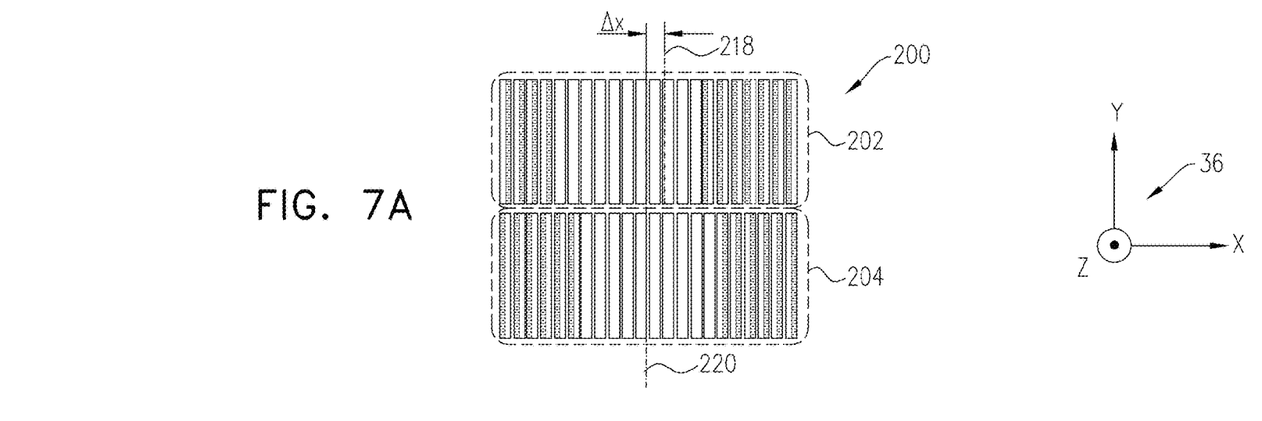
FIG. 7a is a schematic frontal view of an overlay target, in accordance with an alternative embodiment of the invention.
Figure 7B:
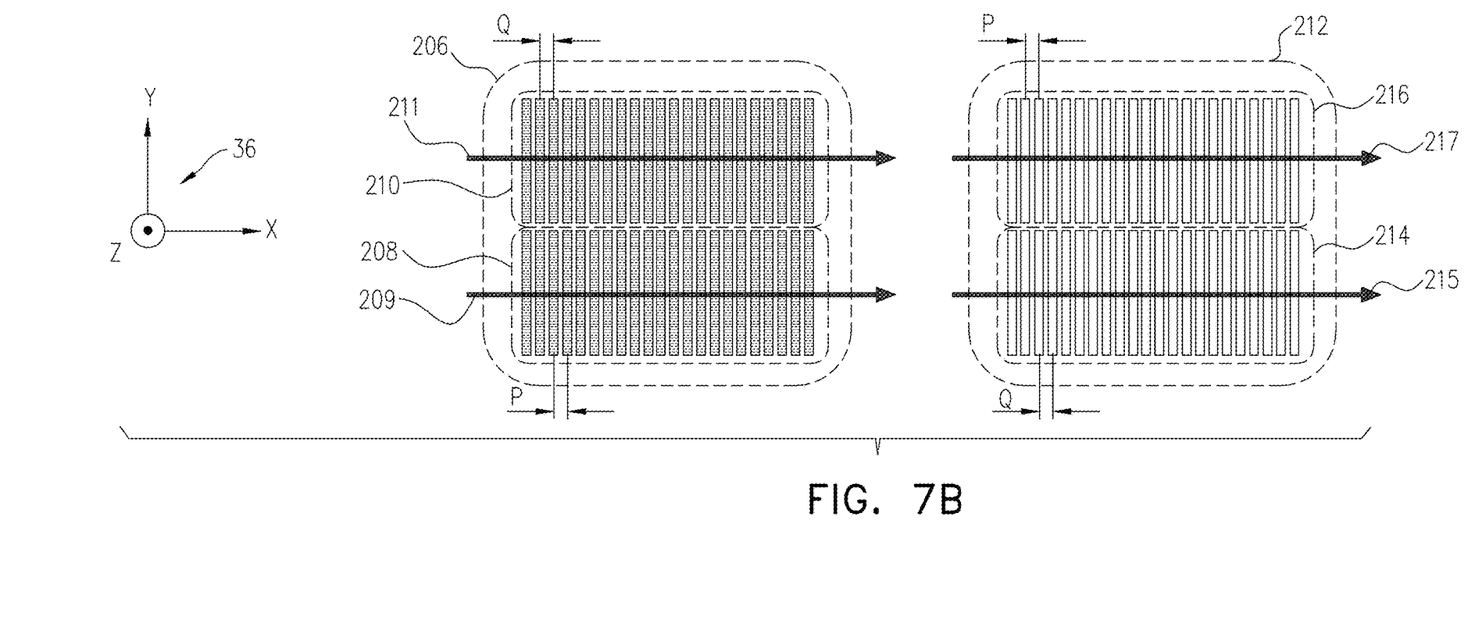
FIG. 7b is a schematic frontal view of gratings used in construction of the overlay target of FIG. 7a, in accordance with an embodiment of the invention.

FIGS. 7a and 7b show an overlay target 200 and its structure, in accordance with an alternative embodiment of the invention. FIG. 7a is a schematic frontal view of overlay target 200, while FIG. 7b is a schematic frontal view of gratings 206 and 212 that are used in construction of the overlay target of FIG. 7a. Overlay target 200 can be designed and used in measuring overlay error, for example in the manner described in the above-mentioned U.S. Pat. No. 7,440,105. In contrast to the targets in this patent, however, target 200 can be made smaller than 10 μm×10 μm, and possibly even smaller than 5 μm×5 μm, and can be placed in active areas 106 of dies 102 (FIG. 2).

As shown in FIG. 7b, target 200 of FIG. 7a comprises first and second linear gratings 206 and 212, formed respectively in layer 38 and layer 40. First grating 206 comprises adjacent (but non-overlapping) sub-gratings 208 and 210, which have respective grating pitches P and Q and grating vectors 209 and 211, wherein the pitches differ by a small amount. For example, pitch Q is given by Q=k×P, wherein k may be 0.99, 0.999, or 1.02, or some other factor close to one. Second grating 212 comprises adjacent (but non-overlapping) sub-gratings 214 and 216, in xy-positions corresponding to those of sub-gratings 208 and 210, respectively, so that the sub-gratings may be overlaid in the lithographic process used in fabricating layers 38 and 40 (FIG. 1). Sub-gratings 214 and 216 have respective grating vectors 215 and 217 and pitches of Q and P, i.e., the same pitches as sub-gratings 208 and 210, but in the opposite spatial order. All four grating vectors 209, 211, 215, and 217 are mutually parallel. Although gratings 206 and 212 are shown in FIG. 7b, for the sake of clarity, as though they were spatially separated in the xy-plane, in the actual lithographic process sub-grating 214 is overlaid on sub-grating 208, resulting in a grating-like structure 204; and sub-grating 216 is overlaid on sub-grating 210, resulting in a grating-like structure 202. (Here we refer to "grating-like structures" as arrays of parallel lines, but with varying linewidths and/or line-to-line separations.)

As described in the above-mentioned U.S. Pat. No. 7,440,105, each grating-like structure 202 and 204 has a respective center of symmetry 218 and 220 in the x-direction. When there is no overlay error $OVL_x$ between first and second gratings 206 and 212, the centers of symmetry 218 and 220 are aligned. However, a non-zero overlay error of $OVL_x$ causes a shift of $\Delta x$ between centers of symmetry 218 and 220, wherein the overlay error $OVL_x$ is magnified to a shift $\Delta x$ by a magnification factor M such that $\Delta x = M \times OVL_x$. The magnification factor M, in turn, is given by $M=P/(P-Q)$. As only respective centers of symmetry 218 and 220 of grating-like structures 202 and 204 need to be identified, but not the individual lines of gratings 208, 210, 214, and 216, pitches P and Q may be much smaller than, for example, the minimum pitch of 1600 nm of gratings 122 and 126 (FIG. 3). Thus, the pitches P and Q may advantageously be reduced to pitches with a better compatibility than a pitch of 1600 nm (or larger) with the photolithographic process that is used for patterning electrical circuit components 108 within active areas 106.

Controller 18 computes the overlay error $OVL_x$ between layer 38 and layer 40 by identifying respective centers of symmetry 218 and 220 of grating-like structures 202 and 204 in the x-direction, computing the shift $\Delta x$ between the centers of symmetry, and from $\Delta x$ computing $OVL_x = \Delta x/M$.

The function of overlay target 200 is the same as the function of overlay target 120 (FIG. 3). Thus, similarly to FIG. 4 hereinabove, overlay target 200 may be paired with a second overlay target rotated by 180° relative to target 200, for enabling a measurement of $TIS_x$. Furthermore, similarly to FIG. 5 hereinabove, two additional overlay targets, rotated by 90°, may be provided for measuring both TIS and overlay error in the y-direction. For targets shown in FIGS. 7a-7b, TIS is reduced by the magnification factor M, and consequently a measurement at 180° orientation of substrate 12 may not be required.

Alternatively, as described in the above-mentioned U.S. Pat. No. 7,440,105, a similar shift of the grating centers may be achieved by forming overlaid gratings in layer 38 and layer 40 with the same pitch, but rotated by a small angle in the xy-plane with respect to each other. For example, grating 214 can be rotated by an angle θ with respect to grating 208, so that grating vector 215 is rotated by angle θ with respect to grating vector 209. Furthermore, grating 216 is rotated by an angle −θ with respect to grating 210, so that grating vector 217 is rotated by an angle −θ with respect to grating vector 211.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A product, comprising:
   a semiconductor substrate;
   at least first and second thin-film layers disposed on the substrate and patterned to define a matrix of dies, which are separated by scribe lines and contain active areas circumscribed by the scribe lines; and
   a plurality of overlay targets formed in the first and second thin-film layers within each of the active areas, each overlay target having dimensions no greater than 10 µm×10 µm in a plane parallel to the substrate and comprising:
      a first linear grating formed in the first thin-film layer and having a first grating vector; and
      a second linear grating formed in the second thin-film layer, in proximity to the first linear grating, and having a second grating vector parallel to the first grating vector.

2. The product according to claim 1, and comprising overlay targets having dimensions no greater than 5 µm×5 µm.

3. The product according to claim 1, wherein the plurality of overlay targets comprises a first set of the overlay targets characterized by a first angular disposition of the first and second linear gratings and a second set of the overlay targets characterized by a second angular disposition of the first and second linear gratings that is rotated with respect to the first angular disposition by 180° around an axis perpendicular to the plane parallel to the semiconductor substrate.

4. The product according to claim 1, wherein the plurality of overlay targets comprises a first set of the overlay targets characterized by a first angular disposition of the first and second linear gratings and a second set of the overlay targets characterized by a second angular disposition of the first and second linear gratings that is rotated with respect to the first angular disposition by 90° around an axis perpendicular to the plane parallel to the semiconductor substrate.

5. The product according to claim 1, wherein each of the overlay targets comprises exactly one first linear grating and one second linear grating.

6. The product according to claim 1, wherein the second linear grating is adjacent to but non-overlapping with the first linear grating in the plane parallel to the semiconductor substrate.

7. The product according to claim 1, wherein the first linear grating comprises a first sub-grating having a first pitch and a second sub-grating adjacent to but non-overlapping with the first sub-grating, having a second pitch not equal to the first pitch, and
   wherein the second linear grating comprises a third sub-grating, which has a third pitch equal to the second pitch and is overlaid on the first sub-grating, and a fourth sub-grating, which is adjacent to but non-overlapping with the third sub-grating and has a fourth pitch equal to the first pitch, and is overlaid on the second sub-grating.

8. The product according to claim 1, and comprising further overlay targets formed within the scribe lines and having dimensions greater than 5 µm×5 µm in the plane parallel to the substrate.

9. A method for measuring an overlay error, comprising:
depositing and patterning at least first and second thin-film layers on a semiconductor substrate to define a matrix of dies, which are separated by scribe lines and contain active areas circumscribed by the scribe lines;
forming a plurality of overlay targets in the first and second thin-film layers within each of the active areas, each overlay target having dimensions no greater than 10 µm×10 µm in a plane parallel to the substrate and comprising a first linear grating formed in the first thin-film layer and having a first grating vector and a second linear grating formed in the second thin-film layer, in proximity to the first linear grating, and having a second grating vector parallel to the first grating vector;
capturing images of the plurality of overlay targets;
processing the images to find a displacement between the first and second linear gratings; and
measuring an overlay error between the first and second thin-film layers responsively to the displacement.

10. The method according to claim 9, wherein the overlay targets have dimensions no greater than 5 µm×5 µm.

11. The method according to claim 9, wherein forming the plurality of overlay targets comprises forming a first set of the overlay targets characterized by a first angular disposition of the first and second linear gratings and a second set of the overlay targets characterized by a second angular disposition of the first and second linear gratings that is rotated with respect to the first angular disposition by 180° around an axis perpendicular to the plane parallel to the semiconductor substrate.

12. The method according to claim 9, wherein forming the plurality of overlay targets comprises forming a first set of the overlay targets characterized by a first angular disposition of the first and second linear gratings and a second set of the overlay targets characterized by a second angular disposition of the first and second linear gratings that is rotated with respect to the first angular disposition by 90° around an axis perpendicular to the plane parallel to the semiconductor substrate.

13. The method according to claim 9, wherein forming the plurality of overlay targets comprises forming exactly one first linear grating and one second linear grating in each of the overlay targets.

14. The method according to claim 9, wherein forming the plurality of overlay targets comprises, in each of the overlay targets, placing the second linear grating adjacent to but non-overlapping with the first linear grating in the plane parallel to the semiconductor substrate.

15. The method according to claim 9, wherein forming the plurality of the overlay targets comprises:
forming the first linear grating by fabricating in the first thin-film layer a first sub-grating having a first pitch a and a second sub-grating adjacent to but non-overlapping with the first sub-grating, having a second pitch not equal to the first pitch, and
forming the second linear grating by fabricating in the second thin-film layer a third sub-grating, which has a third pitch equal to the second pitch and is overlaid on the first sub-grating, and a fourth sub-grating, which is adjacent to but non-overlapping with the third sub-grating and has a fourth pitch equal to the first pitch, and is overlaid on the second sub-grating.

16. The method according to claim 9, and comprising forming further overlay targets within the scribe lines, the further overlay targets having dimensions greater than 5 µm x 5 µm in the plane parallel to the substrate.

17. A method for measuring an overlay error, the method comprising:
depositing and patterning at least first and second thin-film layers on a semiconductor substrate to define a matrix of dies, which are separated by scribe lines and contain active areas circumscribed by the scribe lines;
forming a plurality of overlay targets in the first and second thin-film layers, each overlay target comprising respective first target features in the first thin-film layer and respective second target features in the second thin-film layer;
capturing first images of the plurality of overlay targets in a first angular orientation of the semiconductor substrate with respect to a normal to the semiconductor substrate;
processing the first images to find respective first displacements between the first and second target features;
capturing second images of the plurality of overlay targets in a second angular orientation of the semiconductor substrate that is rotated relative the first angular orientation with respect to the normal to the semiconductor substrate;
processing the second images to find respective second displacements between the first and second target features;
computing a model of overlay error between the first and second thin-film layers based on the first and second displacements; and
computing the overlay error at a given location on the semiconductor substrate using the model.

18. The method according to claim 17, wherein computing the model comprises applying a scanner model, which takes into account misplacement of the semiconductor substrate between subsequent patterning stages in photolithographic patterning the first and second thin-film layers and optical distortions in the photolithographic patterning.

19. The method according to claim 17, wherein the second angular orientation is rotated by 180° with respect to the normal relative to the first angular orientation.

20. The method according to claim 19, wherein computing the model comprises creating first and second overlay models based respectively on the first and second displacements, and wherein computing the overlay error comprises calculating a difference between first and second overlay errors provided respectively by the first and second overlay models at the given location on the semiconductor substrate.

21. The method according to claim 20, wherein computing the overlay error comprises computing a tool-induced shift at the given location on the semiconductor substrate by computing an average of respective values of the first and second overlay errors at the given location.

22. The method according to claim 17, wherein forming the plurality of overlay targets comprises forming at least some of the overlay targets within the active areas of the dies.

23. The method according to claim 22, wherein each of the overlay targets within the active areas has dimensions no greater than 10 µm×10 µm.

24. The method according to claim 17, wherein forming the plurality of overlay targets comprises forming in each of the overlay targets, a first linear grating in the first thin-film layer and a second linear grating in the second thin-film layer, in proximity to the first linear grating, such that a first set of the overlay targets is characterized by a first angular disposition of the first and second linear gratings and a second set of the overlay targets is characterized by a second angular disposition of the first and second linear gratings that is rotated with respect to the first angular disposition by 180° around the normal to the semiconductor substrate.

25. The method according to claim 17, wherein forming the plurality of the overlay targets comprises forming in each of the overlay targets a first linear grating in the first thin-film layer and a second linear grating in the second thin-film layer, in proximity to the first linear grating, such that a first set of the overlay targets is characterized by a first angular disposition of the first and second linear gratings and a second set of the overlay targets is characterized by a second angular disposition of the first and second linear gratings that is rotated with respect to the first angular disposition by 90° around the normal to the semiconductor substrate.

26. The method according to claim 17, wherein computing the model comprises creating an overlay model based on the first displacements, and wherein computing the overlay error comprises calculating a difference between a first overlay error provided by the overlay model and a second overlay error measured based on the second displacements at the given location on the semiconductor substrate.

* * * * *